United States Patent
Rodder et al.

(10) Patent No.: US 6,326,289 B1
(45) Date of Patent: Dec. 4, 2001

(54) METHOD OF FORMING A SILICIDE LAYER USING A PRE-AMORPHIZATION IMPLANT WHICH IS BLOCKED FROM SOURCE/DRAIN REGIONS BY A LAYER OF PHOTORESIST

(75) Inventors: Mark S. Rodder, University Park; Jorge A. Kittl, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/378,824

(22) Filed: Aug. 23, 1999

Related U.S. Application Data
(60) Provisional application No. 60/097,757, filed on Aug. 24, 1998.

(51) Int. Cl.$^7$ .............................................. H01L 21/4763
(52) U.S. Cl. ..................... 438/592; 438/664; 438/651; 438/655; 438/656; 438/683
(58) Field of Search ..................... 438/482, 581, 438/583, 649, 655, 656, 682, 683, 301, 588, 592; 257/412, 382, 383, 384, 385

(56) References Cited
U.S. PATENT DOCUMENTS

| | | | |
|---|---|---|---|
| 4,908,331 | * | 3/1990 | Raaijmakers ........................ 437/187 |
| 5,223,445 | * | 6/1993 | Fuse ........................................ 437/24 |
| 5,739,064 | * | 4/1998 | Hu et al. .............................. 438/528 |
| 5,780,362 | * | 7/1998 | Wang et al. .......................... 438/683 |
| 5,893,751 | * | 4/1999 | Jenq et al. ............................ 438/655 |
| 5,895,245 | * | 4/2000 | Harvey et al. ....................... 438/305 |
| 5,904,564 | * | 5/1999 | Park ...................................... 438/683 |
| 5,940,699 | * | 8/1999 | Sumi et al. .......................... 438/233 |
| 6,087,234 | * | 7/2000 | Wu ........................................ 438/299 |
| 6,107,096 | * | 8/2000 | Mikagi ................................. 435/586 |

OTHER PUBLICATIONS

Wolf and Tauber, "Silicon Processing for the VLSI Era vol. 1: Process Technology", Lattice Press, 1986, pp. 321–324.*

Fuji et al. "Sub–quarter micron titanium salicide technology with in–situ silicidation using high–temperature sputtering" VLSI Technology 1995, pp. 57–58.*

* cited by examiner

*Primary Examiner*—George Fourson
*Assistant Examiner*—Fernando Toledo
(74) *Attorney, Agent, or Firm*—W. James Brady III; Frederick J. Telecky, Jr.

(57) ABSTRACT

An embodiment of the instant invention is a method of making a transistor having a silicided gate structure insulatively disposed over a semiconductor substrate, the method comprising the steps of: forming the gate structure over the substrate (step 102 of FIG. 1); forming a source/drain regions and a channel region in the semiconductor substrate (step 108), the channel region situated between the source/drain regions and under the gate structure; forming a photoresist layer over the source/drain regions (step 110); amorphizing a portion of the gate structure by introducing an amorphizing substance into the gate structure (step 112); removing the photoresist layer after the step of amorphizing a portion of the gate structure step 114); forming a metal layer on the conductive structure, the metal layer interacts with the gate structure in the amorphized portion of the gate structure and the source/drain regions so as to form a lower resistivity silicide on the gate structure and the source/drain regions (step 116); and wherein the photoresist layer blocks the amorphizing substance from the source/drain regions and allows the amorphizing substance to enter the gate structure.

9 Claims, 1 Drawing Sheet

METHOD OF FORMING A SILICIDE LAYER USING A PRE-AMORPHIZATION IMPLANT WHICH IS BLOCKED FROM SOURCE/DRAIN REGIONS BY A LAYER OF PHOTORESIST

This application claims priority under 35 USC §119(e)(1) of provisional application number 60/097,757 filed Aug. 24, 1998.

CROSS-REFERENCE TO RELATED PATENT/PATENT APPLICATIONS

The following commonly assigned patent applications are hereby incorporated by reference:

| Patent No./Serial No. | Filing Date | TI Case No. |
| --- | --- | --- |
| 09/087,411 | 05/29/1998 | TI-23734 |
| 09/110,034 | 07/02/1998 | TI-25319 |
| 09/306,494 | 05/06/1999 | TI-27411 |

FIELD OF THE INVENTION

The instant invention pertains to semiconductor device fabrication and processing and more specifically to a method of forming a silicide region.

BACKGROUND OF THE INVENTION

Titanium silicide has become the most widely-used silicide in the VLSI industry for self-aligned silicide applications because of its combined characteristics of low resistivity, the ability to be self-aligned, and relatively good thermal stability. Although $TiSi_2$ has certain advantages relative to other suicides, the fact that it is a polymorphic material presents additional problems in its use. Specifically, in typical use $TiSi_2$ exists as either an orthorhombic base centered phase having 12 atoms per unit cell and a resistivity of about 60–90 micro-ohm-cm (known in the industry as the C49 phase), or as a more thermodynamically-favored orthorhombic face-centered phase which has 24 atoms per unit cell and a resistivity of about 12–20 micro-ohm-cm (known as the C54 phase). When using the generally-accepted processing conditions for forming titanium silicide, the less-desirable, higher-resistivity C49 phase is formed first. In order to obtain the lower-resistivity C54 phase, a second high-temperature annealing step is required. This second step may be disadvantageous because it can have detrimental effects on the silicide and other integrated circuit elements. However, it may be necessary.

A typical set of processing conditions for forming titanium silicide include: (1) pre-cleaning, (2) titanium deposition, (3) silicide formation at a temperature about 700° C., (4) selective etching, and (5) a phase transformation anneal at a temperature greater than about 700° C. It is the phase transformation anneal that converts the dominant C49 phase to the C54 phase. The initial formation temperature is kept about 700° C. or below in order to minimize over-spacer bridging. The second transformation anneal is performed after any un-reacted titanium and any titanium nitride layers have been selectively removed and is generally performed at temperatures of 50°–200° C. above the formation temperature to insure full transformation to the C54 phase for best control of sheet resistance.

It is generally accepted that the C49 phase forms first because of a lower surface energy than that of the C54 phase. In other words, the higher surface energy of C54 phase forms a higher energy barrier to its formation. The second transformation anneal step used in the standard process above provides the additional thermal energy necessary to both overcome the nucleation barrier associated with forming the new surface and growing the crystalline structure of the newly-forming C54 phase. In VLSI applications, if the phase transformation is inhibited or fails to occur uniformly, a degradation in circuit performance is observed. In some higher-performance circuits, the RC delay associated with a poor phase transformation is typically about 5–10 percent.

A significant limitation on the C49-to-C54 phase transformation is a phenomenon known as agglomeration. If the thermal energy used to obtain the phase transformation is excessive, then a morphological degradation of the titanium silicide results, which is commonly referred to as agglomeration. As line-widths and silicide film thickness decrease, the thermal energy required to affect the C49-to-C54 phase transformation increases, yet the thermal energy level at which the silicide film starts to agglomerate decreases. Thus, there is an ever-shrinking process window for performing this phase transformation, making process control and uniformity more difficult to achieve.

A method to facilitate the transformation from the C49 phase to the C54 phase involves causing at least a portion of the polycrystalline silicon structure to become amorphous. This can be done by subjecting the polycrystalline silicon structure to preamorphization implant (PAI) prior to the deposition of titanium. As is described in a prior patent application assigned to Texas Instruments, TI-25319, this PAI can be accomplished by implanting either Ge or As into the polycrystalline structure so as to make it amorphous for at least 10 to 30 nm into the structure.

A problem with this method is that introduction of the PAI into the source/drain regions of the transistor can damage the transistor. Specifically, the leakage current is degraded.

SUMMARY OF THE INVENTION

Basically, the instant invention involves a method of performing a PAI which eliminates or reduces the amount of PAI which penetrates into the source/drain regions of the transistor.

An embodiment of the instant invention is a method of making a transistor having a silicided gate structure insulatively disposed over a semiconductor substrate, the method comprising the steps of: forming the gate structure over the substrate; forming a source/drain regions and a channel region in the semiconductor substrate, the channel region situated between the source/drain regions and under the gate structure; forming a photoresist layer over the source/drain regions; amorphizing a portion of the gate structure by introducing an amorphizing substance into the gate structure; removing the photoresist layer after the step of amorphizing a portion of the gate structure; forming a metal layer on the conductive structure, the metal layer interacts with the gate structure in the amorphized portion of the gate structure and the source/drain regions so as to form a lower resistivity silicide on the gate structure and the source/drain regions; and wherein the photoresist layer blocks the amorphizing substance from the source/drain regions and allows the amorphizing substance to enter the gate structure. Preferably, the gate structure is comprised of: doped polysilicon, undoped polysilicon, epitaxial silicon, and any combination thereof, and the metal layer is comprised of a material selected from the group consisting of: titanium, Co, W, Mo, nickel, platinum, palladium, and any combination thereof. The amorphizing substance is, preferably, comprised of a substance selected from the group consisting of: As, Ge, or any combination thereof. The photoresist layer may be patterned prior to the step of amorphizing a portion of the gate structure so as to expose the top of the gate structure.

In an alternative embodiment, the method further includes the step of performing a low temperature anneal step after the step of forming a metal layer on the gate structure. Preferably, the low temperature anneal step is performed at a temperature in excess of 600 C. More specifically, the low temperature anneal step is, preferably, performed around 700 to 800 C.

DETAILED DESCRIPTION OF THE DRAWINGS

While the following description of the instant invention revolves around FIGS. 2–6, the instant invention can be utilized in any semiconductor device structure. The instant invention is applicable to the formation of any silicide region. While the preferred amorphizing substance to introduce into the silicon-containing layer or substrate is either Ge or As, any substance/element can be used so that it causes the silicon-containing layer or substrate to become amorphous for at least 10 to 30 nm into the layer or substrate. In addition, while the preferred silicide material is titanium, other materials such as Co, W, Mo, nickel, platinum, and palladium may be used.

Figure 1:
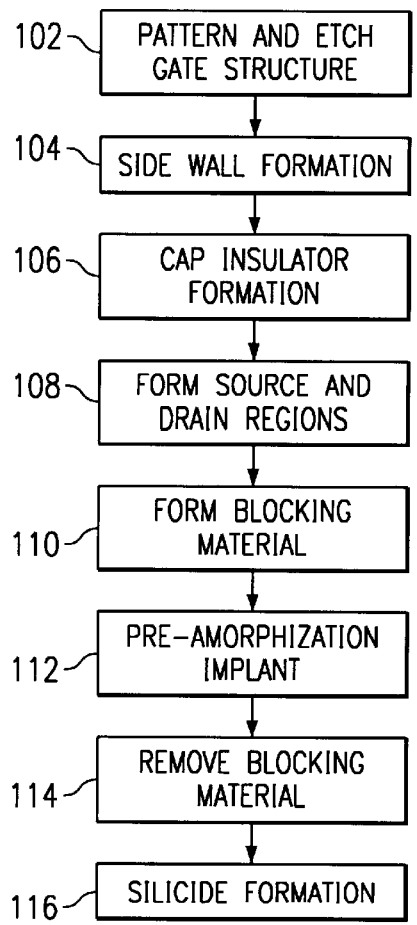
FIG. 1 is a flow chart illustrating the method of one embodiment of the instant invention.
Figure 2:
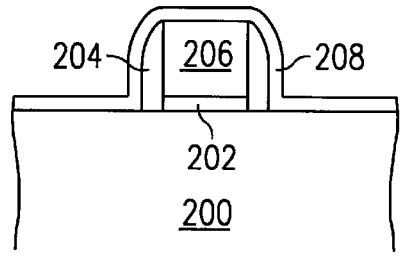

The following description of the method of the instant invention will revolve around FIGS. 1 and 2–6. Referring to FIG. 1 and 2, substrate 200 is provided and a gate dielectric is formed on substrate 200. Gate dielectric 202 may be comprised of an oxide, thermally grown $SiO_2$, a nitride, an oxynitride, or any combination thereof, and is preferably on the order of 1 to 10 nm thick. A layer of silicon-containing material (which will be patterned and etched in step 102 to form gate structure 206) is formed on gate dielectric 202. Preferably, this silicon-containing material is comprised of polycrystalline silicon ("poly" or "polysilicon"), but it may be comprised of amorphous silicon or any other semiconducting material. A dopant is, preferably, introduced into the silicon-containing material so as to increase the conductivity of the silicon-containing material. This is-preferably followed by an anneal step so as to drive the dopant into the silicon-containing material. Alternatively, the dopant may be introduced when the source/drain regions are doped, instead of being doped at this point.

Either before or after the dopant is introduced into the silicon-containing material (preferably prior to the patterning and etching to form the gate structure) and the anneal step is performed, a silicide enhancing substance may be introduced, if at all, into the silicon-containing material. The purpose of this material is to aid in the formation of C54 phase silicide on gate structure 206. Preferably, the silicide enhancing substance is comprised of Mo, Ta, or any other refractory metal. However, this substance may be comprised of many different elements or a combination of elements. More specifically, the silicide enhancing substance is preferably a substance that promotes the formation of C54 phase silicidation of a later deposited metal. Most likely this means that when the subsequent metal layer is deposited on gate structure 206 (which has a fairly high concentration of the silicide enhancing substance at the upper most surface) it will either form the C54 phase silicide directly or will more readily transform from the C49 phase to the C54 phase in a following anneal step.

In step 102, a pattern (not shown) is formed on the silicon-containing layer and portions of the layer are removed so as to form gate structure 206. Preferably this is accomplished by an anisotropic etch step, but one of ordinary skill in the art will know how to perform these patterning and etch steps. Next, implants for lightly doped drain regions may be performed (if at all). This is a standard processing step for both PMOS and NMOS structures.

After gate structure 206 and gate insulator 202 are patterned and etched, sidewall spacers 204 (step 104) are formed and a cap insulation layer 208 is formed over substrate 200 and gate structure 206 (step 106). Preferably, cap insulation layer 208 is comprised of an oxide, a nitride, or a combination of the two and is preferably deposited using standard processing techniques.

Figure 3:
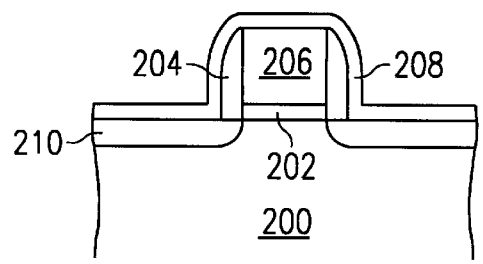
FIGS. 2–3, 4, and 5–6 are cross-sectional views of a partially fabricated transistor which is fabricated using the method of FIG. 1.

Referring to FIGS. 1 and 3, in step 108, source/drain regions 210 are preferably formed by implanting boron (or a boron-containing species such as $BF_2$), phosphorous, and/or arsenic into the substrate and performing an anneal step. Step 108 is a standard processing step in DRAM and logic device process flows.

Figure 4:
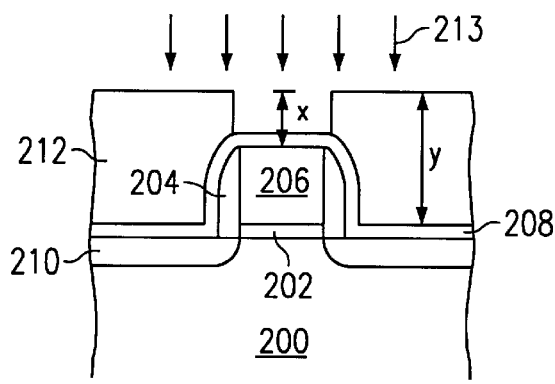

Referring to step 110 of FIG. 1 and FIG. 4, blocking layer 212 is formed in step 110. Blocking layer 212 is preferably comprised of photoresist, which will substantially block the PAI from reaching source/drain regions 210. Photoresist layer 212 may be patterned or, if distance x is small enough to allow the PAI to pass through it and into gate 206, to remain unpatterned.

With respect to blocking layer 212, the distance, y, needs to be large enough so as to block the PAI from the source/drain regions. Depending on what is implanted in the PAI step, the y-distance may be from a couple hundred Angstroms to a few thousand Angstrom thick (more preferably around 500 to 1000 Angstroms thick if Ge or As is implanted). In order for the PAI material to properly enter into gate structure 206, photoresist layer 212 must either be patterned (as shown) or the x-distance should be no more than a couple hundred Angstroms (more preferably no more than 200 Angstroms). The x-distance is measured from the top of gate structure 206 to the top of blocking layer 212. If capping layer 208 is removed prior to this step or if it is not formed, then the x-distance represents the thickness of layer 212 situated on top of gate structure 206. If, however, capping layer 208 is still in place (as is shown in FIG. 4a), then the x-distance is the sum of the thickness of the capping layer and blocking layer 212 situated over gate structure 206. As can be readily determined from the fact that the y-distance need only be as large as is required to effectively block the PAI from the source/drain regions, the x-distance may be zero. In fact, the top of layer 212 may be below the top of gate structure 206.

Figure 5:
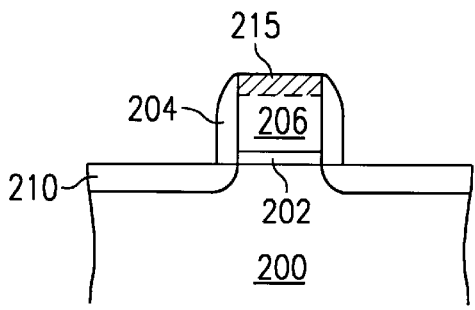

Referring to step 112 of FIG. 1 and FIGS. 4–5, the upper most portion 215 of conductive gate structure 206 is amorphized using the method of the instant invention. In one embodiment of the instant invention, this is accomplished by implanting an amorphizing substance 213, preferably Ge or As, into gate structure 206 at an energy level (preferably around 30 keV or around 20 to 50 keV) and dosage (preferably around $1 \times 10^{14}$ to $5 \times 10^{14}$) sufficient enough to cause the amorphization of around 10 to 50 nm (preferably on the order of 25 to 35 nm—more preferably around 30 nm) into the upper most surface of gate structure 206. Preferably, this implantation step is performed at an angle, θ (measured from perpendicular to the wafer—more specifically zero degrees is perpendicular to the wafer). This angle can be anywhere from zero degrees to 45 degrees. If the PAI is introduced at an angle substantially greater than zero degrees, the wafer can be, either, continuously rotated in the x-y plane, or it may be rotated in discrete step (for example, in four discrete steps such as at φ=0, 90, 180, and 270).

The amorphous region is denoted as region 215 in FIG. 5. In an alternative embodiment, moly, B, Si, $BF_2$, Ti, or any noble gas is implanted into the gate structure (but not into the source/drain regions 210) so as to amorphize the upper most surface of the gate structure. Generally, any substance may be used as the amorphizing agent, but, preferably, not substances that degrade the device (such as Cu or Fe).

In step 114, blocking layer 212 is removed. This is preferably accomplished using standard processing techniques. Next, cap insulating layer 208 is removed using standard processing procedures.

Figure 6:
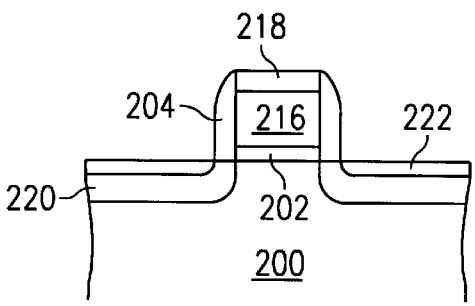

Referring to step 116 of FIG. 1 and FIG. 6, a metal (preferably comprised of Ti, but it can also be comprised of tungsten, molybdenum, cobalt, nickel, platinum, or palladium) is formed on gate structure 206 (over amorphous portion 215), sidewall insulators 204 and the substrate over source/drain regions 210. Silicide regions 222 and 218 are formed in step 116 by reacting the metal with any underlying semiconductor regions by performing a silicide formation step at a temperature of around 700 to 780C. Using the method of the instant invention, a second, high-temperature, anneal step may or may not be necessary to transform silicide regions 222 and 218 to their low resistivity phase (i.e. C54 phase for Ti).

If it is performed, the high temperature anneal step will preferably be at around 800 to 950 C.

Although specific embodiments of the present invention are herein described they are not to be construed as limiting the scope of the invention. Many embodiments of the present invention will become apparent to those skilled in the art in light of methodology of the specification. The scope of the invention is limited only by the claims appended.

What we claim is:

1. A method of making a transistor having a silicided gate structure insulatively disposed over a semiconductor substrate, said method comprising the steps of:

forming said gate structrre over said substrate;

forming source/drain regions and a channel region in said semiconductor substrate, said channel region situated between said source/drain regions and under said gate structure;

forming a photoresist layer over said source/drain regions;

amorphizing a portion of said gate structure by introducing an amorphizing substance into said gate structure;

removing said photoresist layer after said step of amorphizing a portion of said gate structure;

forming a metal layer on said gate structure, wherein said metal layer interacts with said gate structure in said amorphized portion of said gate structure so as to form a lower resistivity silicide on said gate structure;

and wherein said photoresist layer blocks said amorphizing substance from said source/drain regions.

2. The method of claim 1, wherein said gate structure is comprised of a material selected from the group consisting of: doped polysilicon, undoped polysilicon, epitaxial silicon, and any combination thereof.

3. The method of claim 1, wherein said metal layer is comprised of a material selected from the group consisting of: titanium, Co, W, Mo, nickel, platinum, palladium, and any combination thereof.

4. The method of claim 1, further comprising the step of performing a low temperature anneal step after said step of forming a metal layer on said gate structure.

5. The method of claim 4, wherein said low temperature anneal step is comprised of subjecting said transistor to temperatures in excess of 600 C.

6. The method of claim 4, wherein said low temperature anneal step is comprised of subjecting said transistor to a temperature around 700 to 800 C.

7. The method of claim 1, wherein said amorphizing substance is comprised of a substance selected from the group consisting of: As, Ge, or any combination thereof.

8. The method of claim 1, wherein said photoresist layer is patterned prior to said step of amorphizing a portion of said gate structure so as to expose the top of said gate structure.

9. The method of claim 1, wherein the metal layer formed in the forming step also interacts with the source/drain regions so as to form a silicide on said source/drain regions.

* * * * *